(12) United States Patent
Mirzoyan et al.

(10) Patent No.: US 9,853,071 B2
(45) Date of Patent: Dec. 26, 2017

(54) SILICON PHOTOELECTRIC MULTIPLIER WITH VERY LOW OPTICAL CROSS-TALK AND FAST READOUT

(71) Applicant: Max-Planck-Gesellschaft zur Foerderung der Wissenschaften e. V., Munich (DE)

(72) Inventors: Razmik Mirzoyan, Unterschleissheim (DE); Masahiro Teshima, Unterschleissheim (DE); Elena Popova, Moscow (RU)

(73) Assignee: Max-Planck-Gesellschaft zur Förderung der Wissenschaften e. V., Munich (DE)

( * ) Notice: Subject to any disclaimer, the term of this patent is extended or adjusted under 35 U.S.C. 154(b) by 136 days.

(21) Appl. No.: 14/785,074

(22) PCT Filed: Apr. 16, 2014

(86) PCT No.: PCT/EP2014/057806
§ 371 (c)(1),
(2) Date: Oct. 16, 2015

(87) PCT Pub. No.: WO2014/170401
PCT Pub. Date: Oct. 23, 2014

(65) Prior Publication Data
US 2016/0093648 A1 Mar. 31, 2016

(30) Foreign Application Priority Data
Apr. 17, 2013 (EP) .................................. 13164107

(51) Int. Cl.
*H01L 29/40* (2006.01)
*H01L 27/144* (2006.01)
(Continued)

(52) U.S. Cl.
CPC .. *H01L 27/1446* (2013.01); *H01L 31/022408* (2013.01); *H01L 31/107* (2013.01); *H01L 31/1804* (2013.01)

(58) Field of Classification Search
CPC .................................................... H01L 31/0288
See application file for complete search history.

(56) References Cited

U.S. PATENT DOCUMENTS

2010/0053594 A1 3/2010 Yuan et al.
2013/0099100 A1 4/2013 Pavlov

FOREIGN PATENT DOCUMENTS

CN 1998091 A 7/2007
CN 102956739 A 3/2013
(Continued)

OTHER PUBLICATIONS

Chinese Office Action/Search Report cited in Chinese Application No. 201480022141.1 dated Apr. 25, 2016, 12 pgs.
(Continued)

*Primary Examiner* — Samuel Gebremariam
(74) *Attorney, Agent, or Firm* — Cooper Legal Group, LLC (57) ABSTRACT

The silicon-based photomultiplier device comprises a substrate (1), a first layer (2) of a first conductivity type, a second layer (3) of a second conductivity type formed on the first layer, wherein the first layer (2) and the second layer (3) form a p-n junction, wherein the first layer (2) and the second layer (3) are disposed on or above the substrate (1). A material layer (15) between the substrate (1) and the first layer (2) fulfills the function of a light absorber, thereby efficiently suppressing crosstalk between adjacent cells of the device. Material layer (15) may further serve as an electrode for readout of electrical signals from the device.

12 Claims, 6 Drawing Sheets

(51) Int. Cl.
*H01L 31/0224* (2006.01)
*H01L 31/107* (2006.01)
*H01L 31/18* (2006.01)

(56) References Cited

FOREIGN PATENT DOCUMENTS

| | | |
|---|---|---|
| EP | 1755171 B1 | 12/2009 |
| GB | 2479053 A | 9/2011 |
| JP | H04293264 A | 10/1992 |
| WO | 2007118330 A1 | 10/2007 |
| WO | 2008048694 A2 | 4/2008 |
| WO | 2012/083983 A1 | 6/2012 |
| WO | 2012083983 A1 | 6/2012 |

OTHER PUBLICATIONS

International Search Report cited in PCT Application No. PCT/EP2014/057806 dated May 27, 2014, pp. 1-17.

SILICON PHOTOELECTRIC MULTIPLIER WITH VERY LOW OPTICAL CROSS-TALK AND FAST READOUT

The present invention is related to a silicon-based photoelectric multiplier device and a method for fabricating a silicon-based photoelectric multiplier device.

The invention in general relates to the field of semiconductor optoelectronic devices, particularly to photo-detectors with high efficiency of light detection, including the visible part of the spectrum. The photo-detectors according to the invention can be used in a wide field of applications, which employ the detection of very weak and fast optical signals as, for example, industrial and medical tomography, life science, nuclear, particle and astro-particle physics etc.

A silicon-based photoelectric multiplier (SiPM) according to the state of the art (see e.g. EP 1 755 171 B1) is composed of an array of individual cells. In particular the SiPM comprises a silicon substrate and a plurality of cells which are located on a surface of said substrate. Each cell comprises an internal individual quenching resistor made of, for example, high resistant polysilicon and located on top of a silicon oxide layer which covers all cells. In operation each cell is supplied with reverse bias that exceeds the breakdown voltage. When a photon is absorbed in the cell, a Geiger discharge takes place, the discharge being limited by the quenching resistor.

One major problem of these devices can be described as "optical cross-talk" wherein different forms of optical cross-talk can appear in the devices. One form of optical cross-talk originates from photons created in the Geiger discharge of a neighbouring cell. Another form of optical cross-talk, which is addressed by the present disclosure, originates from photons produced in the multiplier at an inclined angle at a first cell, being totally internally reflected at the back or side surface of the device and impinging into another cell from the back side or side wall and initiating a Geiger discharge in there. Because the total internal reflection efficiency is 100% the back reflected photon can survive several reflections from the walls of the SiPM before being absorbed by one of the cells and firing it. Another type of cross-talk ("bulk cross-talk") can be induced via photons from a Geiger avalanche producing charge carriers somewhere in the bulk of the silicon substrate that can migrate towards the neighbour cells and fire them.

One further problem of these devices is that the light-to-current response can be such that the charge collection time after being hit by a photon (the so-called fast component) can be very short (just a couple of ns) but, however, the so-called slow component due to the discharge current flowing through the quenching resistor can be of the order of several 10 nanoseconds till several 100 of nanoseconds due to RC time constants of the electrical circuitry which is employed for driving the device and readout electrical signals from the device. On the other hand many potential applications of silicon photoelectric multiplier devices like, for example, PET (Positron Emission Tomography), HEP (High Energy Physics) detectors etc., call for a fast light-to-current response on the order of 1 ns or even shorter time constants.

It is therefore an object of the present invention to provide a silicon-based photoelectric multiplier with improved properties with respect to one or more of suppression of optical cross-talk or readout, and a method for fabricating the same.

This object is solved by the features of the independent claims. Advantageous embodiments are subject of the dependent claims.

One general idea of the present disclosure is to provide a substrate of a material of any appropriate kind for producing novel type silicon-based photo-multiplier devices. The term "silicon-based" may refer only to the active layer of the device, but not any more to the substrate which in principle can be made of any material or configuration. The substrate may have a function of giving the device mechanical stability as well as it could also have a function as an absorber which efficiently absorbs photons produced in Geiger avalanches of cells. On top of the substrate one may deposit one or more special layers which may have a function of amplifying the absorption effect and/or a function of an additional electrode for reading out electrical signals from the device. In particular, this layer could be made of conductive material so that it may serve as well or alone for an electrode to be used for readout of electrical signals from the device.

A first aspect is therefore directed to a silicon-based photoelectric multiplier device which comprises a substrate, a first layer of a first conductivity type, a second layer of a second conductivity type formed on the first layer, wherein the first layer and the second layer form a p-n junction, wherein the first layer and the second layer are disposed on the substrate.

According to an embodiment of the photoelectric multiplier device, the substrate is one or more of a conductive, semiconductor, or of an insulating type.

According to an embodiment of the photoelectric multiplier device, the first layer is grown epitaxially onto the substrate. The second layer may then be formed in or on the first layer as will be illustrated later in an embodiment. The upper surface of the substrate, onto which the first layer is grown epitaxially, might be prepared in a special way so that epitaxial growth of the first layer is possible. In particular, in case of a substrate which is not being made of a semiconductor material, it might be necessary to deposit a layer like, for example, a semiconductor layer, so that a subsequent epitaxial growth of the first layer is possible.

According to an embodiment of the photoelectric multiplier device, the first layer and the second layer are deposited as a whole, in particular glued onto the substrate. In particular, the first and second layers can first be fabricated on a silicon substrate, thereafter the silicon substrate can be thinned from the backside and then the first and second layers can be applied onto another substrate by gluing or adhering.

According to an embodiment of the photoelectric multiplier device, a material layer can be disposed between a main upper surface of the substrate and a main lower surface of the first layer, wherein the material layer can be made of a material different from the material of the substrate. The material layer may serve for different functions. First, as outlined above, the material layer may be made of a semiconductor material, in particular in cases in which the substrate is not being made of a semiconductor material so that the material layer may allow an epitaxial growth of the first layer in a subsequent step onto the material layer. Second, the material layer may fulfil the function of a light absorber, wherein in particular the material of the material layer may be chosen such that a reflectivity of light with a wavelength in a range of about 1000 nm incident on an interface between the first layer and the material layer is low or very low, in particular well below 100%, less than 50% or less than 25%. In this way the material layer may serve to efficiently suppress optical cross-talk between adjacent cells of the device. Third, the material layer may serve as an electrode to be used for readout of electrical signals from the device. Examples therefore will be shown in greater detail below. One or more of the above first to third functions of the material layer may be accomplished at once with the material layer. According to an embodiment, the material of the material layer comprises one or more of a metal, a metal compound, a metal alloy, and a semiconductor of pure or composite type. The material layer can be formed from one and only one of an element metal. however, it is also possible to form an alloy of two or more metals or of one metal and another element to form the material of the material layer. Besides metals also semiconductor materials can be used as the material of the material layer. It is also possible to use an alloy semiconductor as material for the material layer. According to an embodiment, the material layer can be deposited onto the upper surface of the substrate by an evaporation technique or by sputtering or any other conventional technique. The thickness of the material layer can be in the range of 5 nm to 1000 nm, in particular 5 nm to 500 nm, in particular 5 nm to 100 nm. According to another embodiment, the material layer can be generated by an ion implantation step wherein the parameters of the ion implantation are selected such that, due to an implantation-induced damage of the crystal lattice, an absorption length of light with a wavelength in a range of ≈1000 nm is decreased so that light incident on the front side will not be transmitted. According to an embodiment thereof the back surface of the substrate is processed by an ion implantation step comprising an ion dose in the range of $10^{13}$ to $10^{15}$ cm$^{-2}$ and an ion energy in the range of 1 MeV to 10 MeV.

According to an embodiment of the photoelectric multiplier device, the device further comprises a first electrode and a second electrode to provide a bias voltage to the device. The first electrode can be connected with the second layer and the second electrode can be connected with a conductive substrate or with a material layer disposed on or above the substrate.

According to an embodiment of the photoelectric multiplier device, the device comprises three electrodes or terminals, namely two electrodes for biasing the device and a third electrode for readout of the electrical signals. In particular, the device comprises a first electrode and a second electrode to provide a bias voltage to the device, and a third electrode arranged to provide an output signal from the device which may be induced electrostatically. The first electrode can be connected with the second layer and the second electrode can be connected with a conductive substrate or with a conductive material layer disposed on the substrate. The third electrode may be provided in the form of a conductive layer disposed on or above the first layer, i.e. above the active layer. In fact the third electrode may be more a terminal than an electrode as it would not provide a further potential to the device but rather serves for readout of electrical signals from the device. Examples will be shown below in further detail.

According to an embodiment of the photoelectric multiplier device, the device further comprises a plurality of photosensitive cells, wherein the first electrode is arranged to provide an electrical potential to the photosensitive cells, the second electrode is arranged as a ground electrode for the photosensitive cells, and the third electrode is arranged to provide an output signal from the photosensitive cells, wherein as outlined before the third electrode may be more a terminal than an electrode.

According to an embodiment of the photoelectric multiplier device, isolation trenches can be formed between neighbouring cells for suppressing residual optical crosstalk due to light which is spread within the first layer. The trenches can be arranged in the form of cross-sectional V-grooves between neighbouring cells but also alternative techniques like, for example, plasma etching, can be used for forming such isolating trenches. According to an embodiment, cells, in particular neighbouring cells, can be separated from each other by opaque material placed in V-, vertical or any other form grooves.

According to an embodiment of the photoelectric multiplier device, also the substrate can be configured as a flexible, bendable or twistable substrate like, for example, a flexible printed circuit board (flexboard) so that the substrate can be mounted on any non-planar surface like, for example, a hemispherical surface.

One important advantage of the photoelectric multiplier device is that optical cross-talk as described above can be significantly reduced to a low or very low level. Also the above-described bulk cross-talk can be significantly reduced or even made impossible in embodiments in which the silicon bulk is practically excluded and in which the bulk is made from alternative materials and its only function is the mechanical support and possibly also absorption of photons from Geiger avalanches.

One further advantage of the photoelectric multiplier device may be automatically achieved with most or all of the embodiments described here, namely a very high radiation hardness of the device. In particular in those cases in which there is no silicon bulk in the design of the device, any radiation that otherwise could have been captured by the bulk, damaging it and producing charge carriers that could diffuse or migrate towards the active cells and fire them, would be practically excluded.

A second aspect of the present disclosure is related to a method for fabricating a silicon-based photoelectric multiplier, wherein the method comprises providing a substrate, applying a layer compound onto the substrate, the layer compound comprising a first layer of a first conductivity type and a second layer of a second conductivity type, wherein the first layer and the second layer form a p-n junction, and wherein a main lower surface of the first layer faces a main upper surface of the substrate.

According to an embodiment of the method, the first layer is grown epitaxially onto the substrate and the second layer is fabricated onto the first layer by, for example, diffusion doping or ion implantation doping. The first layer may be grown directly epitaxially onto the substrate or onto a material layer which is disposed on the substrate and which makes epitaxial growth possible in cases in which, for example, the substrate is not made of a semiconductor or also in cases in which the substrate is made of a semiconductor but for reasons of lattice mismatch does not allow direct epitaxial growth of the first layer.

According to an embodiment of the method, a first substrate is provided wherein the first substrate is a silicon substrate or a silicon based substrate, providing a first layer of a first conductivity type and a second layer of a second conductivity type on the first substrate, wherein the first layer and the second layer form a p-n junction, removing a portion of the first substrate on a backside remote from the first and second layers, and applying the first substrate to a second substrate. The second substrate can be one or more of a conductive, semiconductor or of an insulating type. The thinned first substrate can be applied onto the second substrate by adhering or gluing, for example.

According to an embodiment of method, a material layer is applied between the first layer and the substrate or the second substrate, respectively. The material of the material layer can be such and can have properties and purposes as was explained above in connection with the photoelectric multiplier device.

According to an embodiment of method, a first electrode and a second electrode are arranged to provide a bias voltage to the device. The first electrode can be connected to the second layer and the second electrode can be connected to the substrate if a conductive substrate has been chosen. In this case the readout can be performed from the bottom of the substrate.

According to an embodiment of method, a first electrode and a second electrode are arranged to provide a bias voltage to the device and a third electrode can be arranged to provide an output signal from the device. In case of the presence of a material layer as specified above and moreover in case of a conductive material layer, the third electrode can be connected with the material layer.

A further aspect of the present disclosure relates to a radiation detector comprising a scintillator and an array of silicon-based photoelectric such as those described in this application, wherein the silicon-based photoelectric multipliers are arranged to receive bursts of light produced by the scintillator in response to received radiation.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION

The aspects and embodiments are now described with reference to the drawings, wherein like reference numerals are generally utilised to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practised with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the Figures are not necessarily to scale.

In the following detailed description, reference is made to the accompanying drawings, which form a part thereof, and in which is shown by way of illustration specific embodiments in which the invention may be practised. In this regard, directional terminology, such as "upper", "lower", "left-hand", "right-hand", "front side", "backside", etc., is used with reference to the orientation of the Figure(s) being described. Because components of embodiments can be positioned in a number of different orientations, the directional terminology is used for purposes of illustration and is in no way limiting. It is to be understood that other embodiments may be utilised and structural or logical changes may be made without departing from the scope of the present invention.

Figure 1:
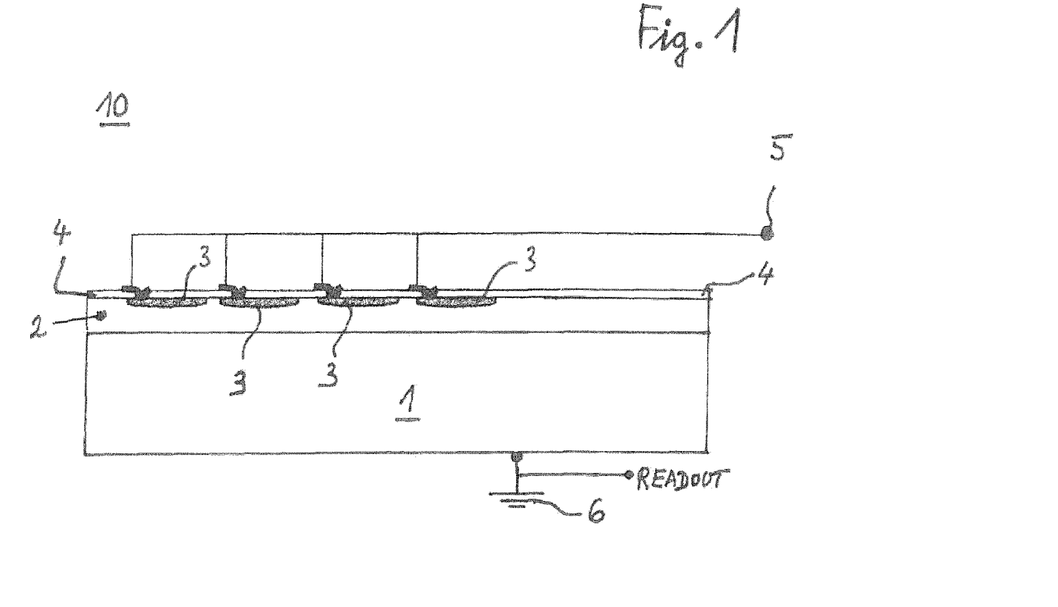
FIG. 1 shows a schematic cross-sectional representation of a partial section of an exemplary silicon-based photoelectric multiplier comprising an arbitrary substrate and readout from the bottom of the substrate.

FIG. 1 illustrates a cross-sectional side view representation of a silicon-based photoelectric multiplier device according to an example. The multiplier device 10 of FIG. 1 shows a plurality of neighbouring photocells in an upper portion of the device 10. The device 10 comprises a substrate 1 which can be a common substrate for all photocells, a first layer 2 which can also be common for all photocells, and individual second layers 3 in each one of the photocells. The first layer 2 may comprise a first conductivity type as, for example n-type, and the second layers 3 may comprise a second conductivity type as, for example, p-type. The assembly of the first layer 2 and the second layers 3 may also be called "active layer". The second layers 3 may be fabricated by spatially selectively doping a previously homogeneous first layer 2, as for example by diffusion doping or ion implantation doping through a mask in order to generate the p-doped second layers 3. Subsequently a dielectric layer 4 is grown on the upper surface of the first layer 2. Via holes are formed in the dielectric layer 4 above each one of the second layers 3, and the via holes are filled with a conductive material so that each one of the second layers 3 can be connected by suitable wiring layers to a first electrode 5 for applying an electric potential to them. The substrate 1 can be made of a conductive material so that it can be connected to a second electrode or a mass potential 6. The first electrode 5 and the mass potential 6 thus serve to apply a bias voltage to each one of the photocells of the device 10. The readout of the device can also be performed from the bottom of the substrate as shown. If the substrate 1 is made of a non-conductive, or insulating or of a semiconductor, then the second electrode or mass potential can be connected with the first layer 2 and the readout can also be performed from the first layer 2. Quenching resistors (not shown) for quenching the avalanche current may be provided in each one of the photocells as, for example, in the electrical lines leading from the first electrode 5 to the individual photocells, namely to the second layers 3. The quenching resistors can be made of polysilicon, metal, metal alloy and/or other material(s) and combination of different materials which can be used as quenching resistor or surface-implanted silicon or silicon volume or any other scheme of active quenching. Trenches between the cells can be located in any part of layer 2 and/or material layer 15 and/or isolating layer 16.

Figure 7:
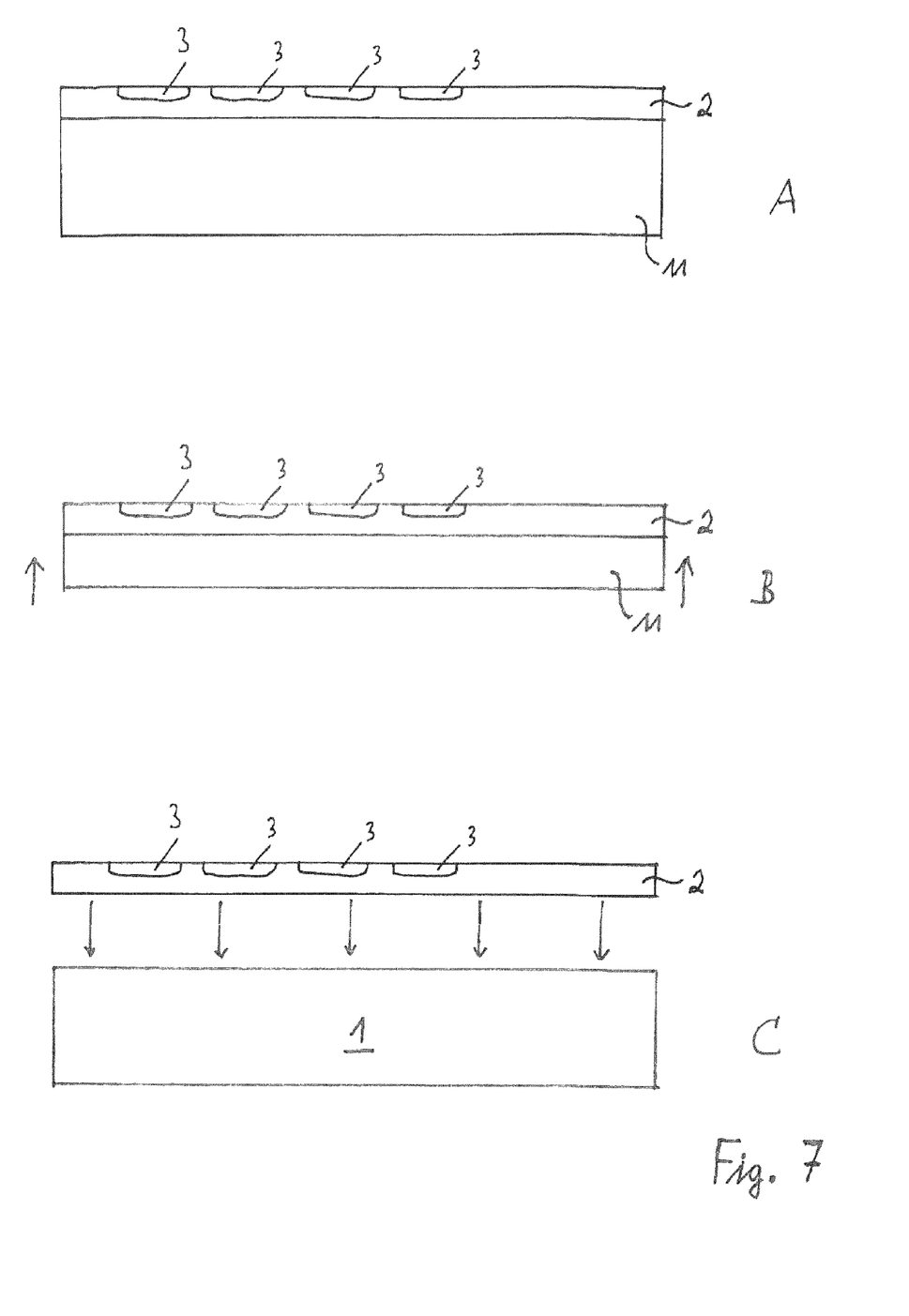
FIG. 7A-C show schematic cross-sectional representations for illustrating an exemplary method for fabricating a silicon-based photoelectric multiplier device.

The device 10 as shown in FIG. 1 can be fabricated according to different methods. One method is explained in further detail in FIGS. 7A-C. In a first step shown in FIG. 7A, the active layer is produced on top of a silicon substrate (first substrate) by epitaxially growing the n-doped first layer 2 on the upper surface of the silicon substrate or by implanting dopant atoms or ions into the upper surface of the silicon substrate, and thereafter generating the p-doped second layers 3 by spatially selectively doping the first layer 2 as described above. In a second step shown in FIG. 7B, the silicon substrate is thinned to a minimum necessary thickness as indicated by the arrows in FIG. 7B. The thinning can be performed on the backside by, for example, one or more of grinding, polishing or chemical-mechanical polishing (CMP). The silicon substrate can be thinned until the first layer 2 is reached from the backside or alternatively a residual layer of the silicon substrate 11 can be left. The final thickness can be thus in the order of as low as, for example, 0.5 µm up to 5 µm or 10 µm. In a third step as shown in FIG. 7C, the thinned silicon substrate is applied onto the substrate 1 as indicated by the arrows in FIG. 7C. The substrate 1 can be a substrate as shown and described in connection with FIG. 1. The step of applying the thinned substrate 11 can be performed by anyone or more of bonding, gluing, adhering. The special process of applying the thinned substrate to the substrate 1 may be selected according to the material of the substrate 1, in particular to properties like surface structure, surface energy potentials, bonding capabilities etc. The device 10 of FIG. 1 may thus further comprise an adhesion layer or bonding layer or gluing layer (not shown) disposed between the substrate 1 and the first layer 2. Before applying the thinned substrate 11 to the substrate 1, it is possible to apply a material layer 15 such as that shown in FIGS. 3 and 4A,B to the upper surface of the substrate 1.

A further method of fabricating the device 10 of FIG. 1 is by epitaxial growth of the first layer 2 onto the substrate 1 and then fabricating the second layers 3 by spatially selectively introducing dopant atoms or ions into the first layer 2 in the desired areas. It might be necessary to prepare the substrate 1 in a particular way so that epitaxial growth of the first layer 2 becomes possible. In other words, it might be necessary to provide surface conditions equal or similar to the surface of a silicon substrate. If the substrate 1 is a silicon substrate or a silicon-based substrate, then epitaxial growth of the first layer 2 will be possible without further modifications. If, however, the substrate 1 is no silicon substrate and may be another semiconductor substrate or not even a semiconductor substrate but instead any other material like ceramic, plastic, PCB or a metal, then it might be necessary to grow at first an intermediate layer onto the substrate 1 which allows the subsequent epitaxial growth of the first layer 2 onto the intermediate layer. The intermediate layer which is not shown in FIG. 1 could then be selected such that it may also serve for further purposes like, for example, acting as an efficient absorber for optical radiation which might otherwise lead to optical cross-talk. One example for such an intermediate layer is a SiGe layer.

Figure 2:
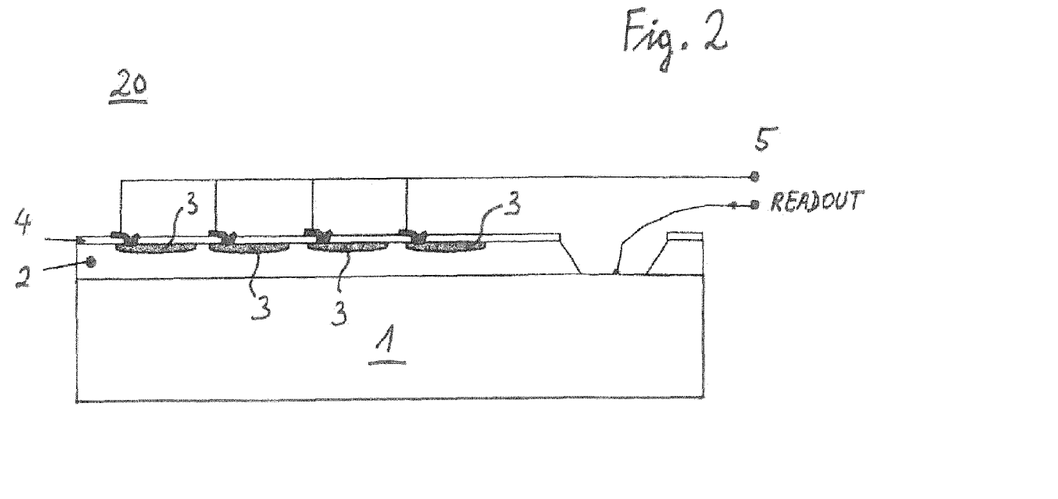
FIG. 2 shows a schematic cross-sectional representation of a partial section of an exemplary silicon-based photoelectric multiplier comprising a conductive substrate and readout from the top of the substrate.

FIG. 2 illustrates a cross-sectional side view representation of a silicon-based photoelectric multiplier device according to an example. The photoelectric multiplier device 20 of FIG. 2 is similar to the device 10 of FIG. 1. One difference is that the substrate 1 of the device 20 is necessarily a conductive substrate 1. A further difference is that a recess is formed in the first layer 2 and the overlying dielectric layer 4 in an edge portion of the device 20 to allow access to the conductive substrate 1 from the front side of the device 20. An electrical wire or lead as shown in FIG. 2 is fed in the recess and contacted with an upper surface of the material layer 15. The wire or lead can be used to read out electrical signals from the device 20. In addition it is possible to apply a mass potential or that one of a second electrode through the lead from the front side of the device 20 to the conductive substrate 1.

Figure 3:
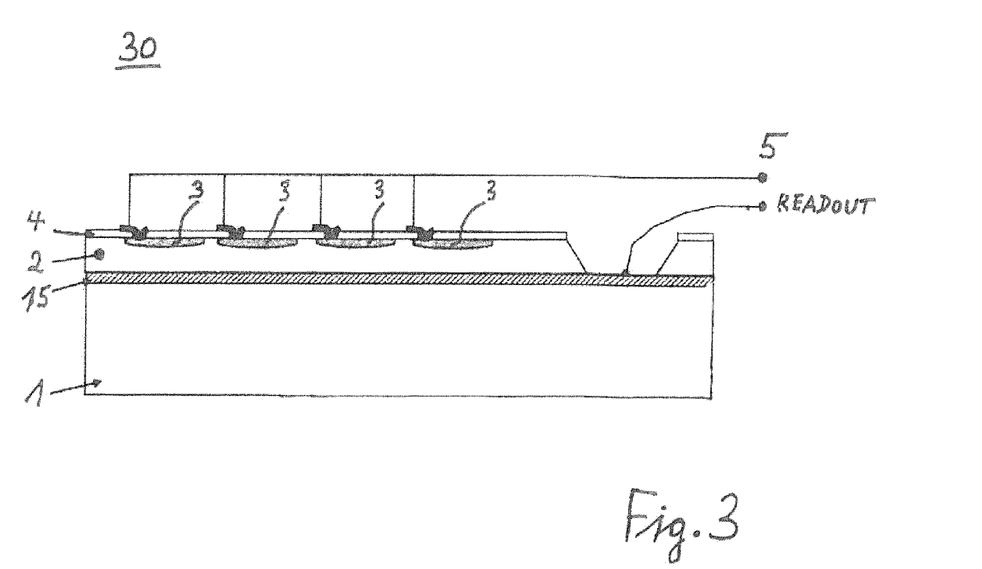
FIG. 3 shows a schematic cross-sectional representation of a partial section of an exemplary silicon-based photoelectric multiplier comprising a conductive layer on the substrate and readout through the conductive layer.

FIG. 3 illustrates a cross-sectional side view representation of a silicon-based photoelectric multiplier device according to an example. The photoelectric multiplier device 30 of FIG. 3 is similar to the device 20 of FIG. 2. One difference is that the substrate 1 can be made of any desired material as the substrate 1 of device 10 in FIG. 1. A further difference is that a conductive material layer 15 is formed on the upper surface of the substrate 1. In this embodiment the readout wire or lead is contacted with an upper surface of the material layer 15. Also in this case a mass potential or a potential of a second electrode may be applied to the material layer 15. The material of the material layer 15 can further be selected such that the material layer 15 further acts as an absorber layer for optical radiation from the photocells which might otherwise lead to optical cross-talk in the device 30.

Figure 4A:
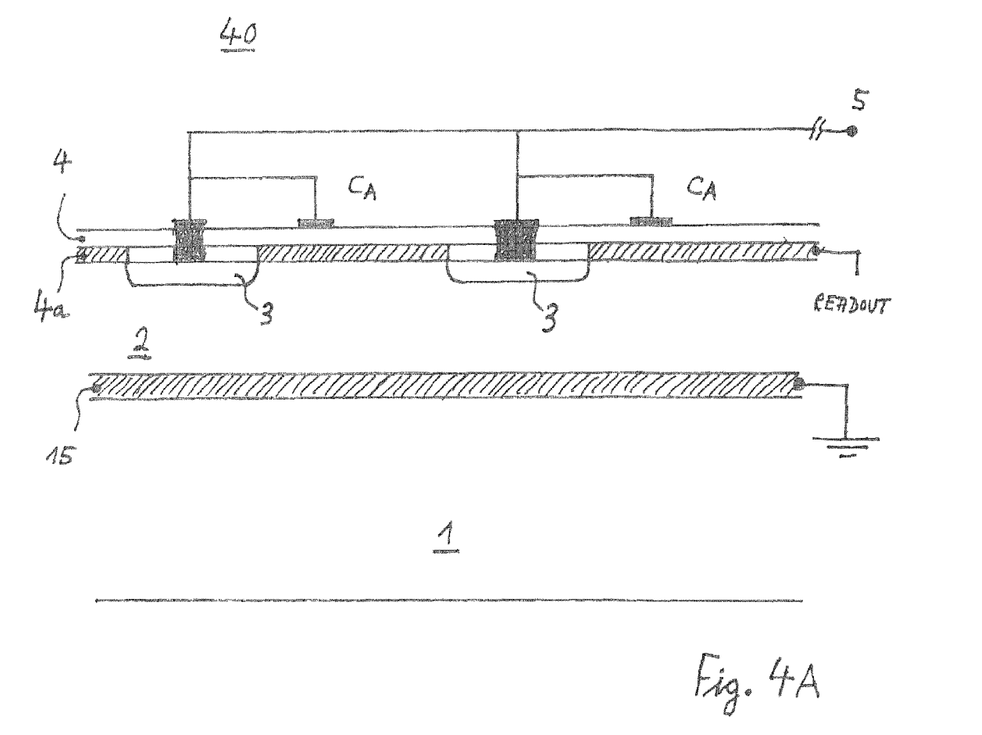
FIG. 4A, B shows a schematic cross-sectional representation of a partial section of an exemplary silicon-based photoelectric multiplier comprising a conductive layer on the substrate, and an further electrode layer on top of the active layer (A) and an equivalent circuit representation thereof (B)
Figure 4B:
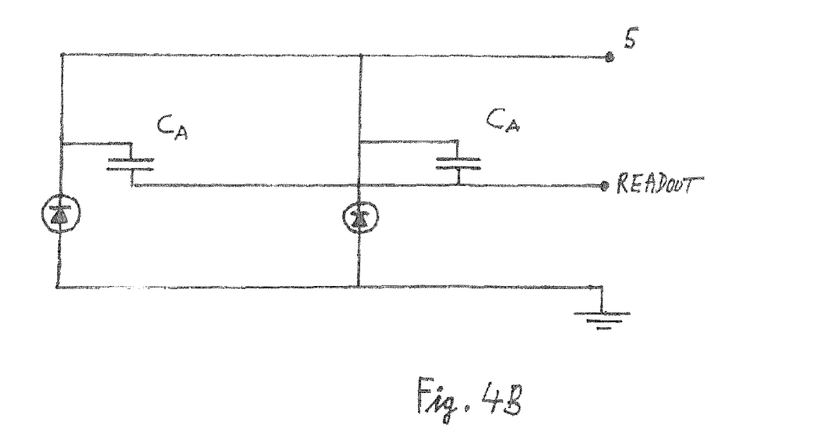

FIG. 4A illustrates a cross-sectional side view representation of a partial section of a silicon-based photoelectric multiplier device according to an example. The photoelectric multiplier device 40 of FIG. 4 is similar to the device 30 of FIG. 3. One difference is that one further electrode layer 4a is arranged on the first layer 1. To understand the principle function of this device, reference is first made to FIG. 4B. It may be the case that read out through a conductive substrate 1 or through a conductive layer 15 as was shown in the devices of FIGS. 1 to 3 leads to a slow light-to-current response, in particular a slowly decaying component due to an RC time constant wherein C represents a parasitic capacitance between the active layer and the conductive substrate 1 or the conductive layer 15. A possible way to get rid of the these long components is to implement artificial capacitances $C_A$ at the photocells and to read out the electrical signals electrostatically by only sensing the displacement current of the electrical signal at a point above the active layer so that the capacitance between the active layer and the substrate is not involved. The artificial capacitances can be implemented by disposing the further electrode layer 4a on the first layer 1 in such a way that it comprises openings above the second layers 3. At each photocell an additional electrical wire is branched off the bias voltage feed line and connected with an electrical pad on the dielectric layer 4. This pad forms the artificial capacitance with the underlying portion of the third electrode layer 4a. An additional insulation layer can further be provided between the upper surface of the first layer 2 and the lower surface of the third electrode layer 4a in order to ensure galvanical insulation of the third electrode layer 4a from the active layer. The openings above the second layers 3 can be made slightly larger than the lateral size of the second layers 3 so that incident light under inclined angles can also reach the active zone. In addition or alternatively the third electrode layer 4a can be fabricated as a transparent layer.

Figure 5A:
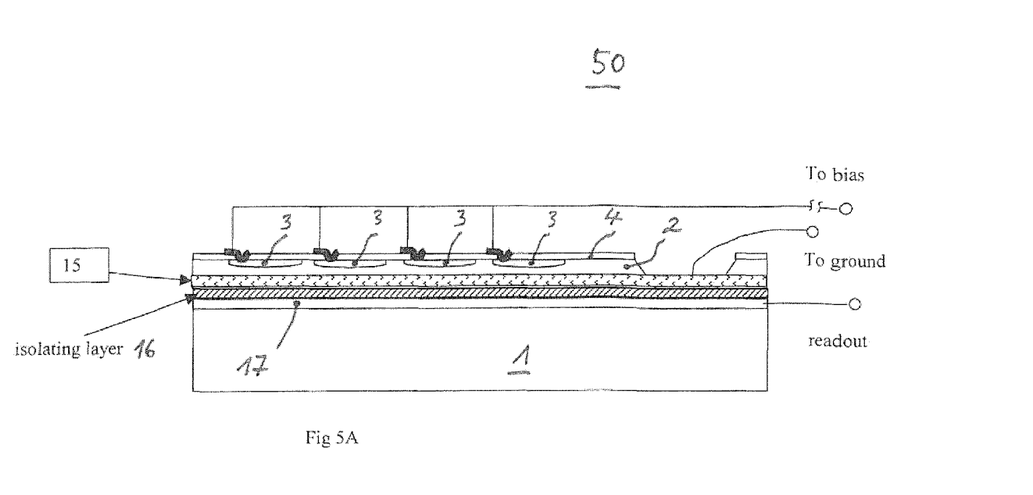
FIG. 5A, B shows a schematic cross-sectional representation of a partial section of an exemplary silicon-based photoelectric multiplier comprising a conductive layer on the substrate, and an further electrode layer on top of the active layer (A) and an equivalent circuit representation thereof (B)

FIG. 5A,B illustrate a further example of a silicon-based photoelectric multiplier. The photoelectric multiplier device 50 of FIG. 5A,B is similar to the device 30 of FIG. 3. One difference is that underneath the material layer 15 an insulating layer 16 and a electrical layer 27 for readout are disposed. The readout mechanism is similar to that of FIG. 4A,B in that artificial capacitances $C_A$ are implemented at the photocells and the electrical signals are read out electrostatically by only sensing the displacement current of the electrical signal at a point below the active layer.

Figure 5B:
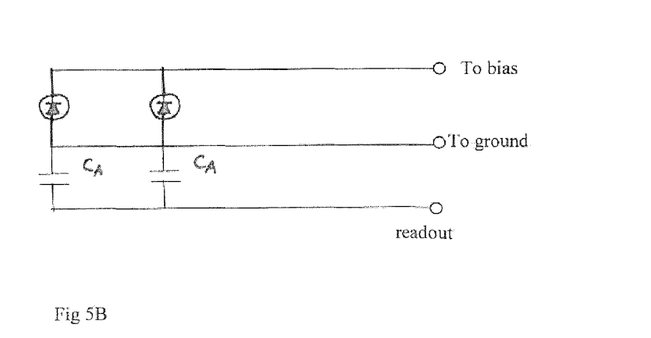
Figure 6:
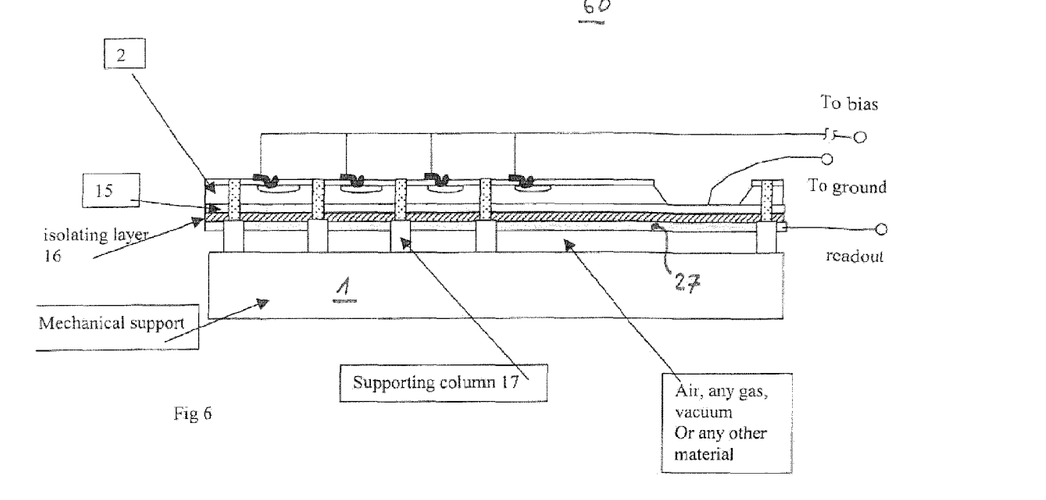
FIG. 6 shows a schematic cross-sectional representation of a partial section of an exemplary silicon-based photoelectric multiplier comprising a mechanical support and supporting columns carrying the device layer.

FIG. 6 illustrates a further example of a silicon-based photoelectric multiplier. The photoelectric multiplier device 60 of FIG. 6 is similar to the device 50 of FIG. 5A,B. One difference is that the lowest layer, namely the electrical readout layer 27 is not disposed directly on the mechanical support 1. There are instead provided supporting columns 17 which are connected with the mechanical support 1 and extend in an upright direction through the layer compound consisting of the active layer, the material layer, the insulating layer 16, and the readout layer 27 up to the upper surface of the dielectric layer 4. The upper part of the supporting columns may help to block optical cross-talk between neighbouring photocells. The empty space between the readout layer 27 and the mechanical support 1 can be filled with a medium like, for example, air or any other gas or any other material, or the space can also be evacuated.

FIG. 7A-C illustrate cross-sectional side view representations for illustrating an example for fabricating a silicon-based photoelectric multiplier device which was already explained above in connection with FIG. 1.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

The invention claimed is:

1. A silicon-based photoelectric multiplier device, comprising:
    a substrate;
    a first layer of a first conductivity type;
    a plurality of photosensitive cells, wherein:
        each photosensitive cell of the plurality of photosensitive cells comprises a second layer of a second conductivity type formed on a main upper surface of the first layer remote from the substrate,
        the first layer and the second layer form a p-n junction, and
        the first layer and the second layer are disposed on or above the substrate; and
    a material layer disposed between a main upper surface of the substrate and a main lower surface of the first layer, wherein:
        the material layer is made of a material different from a material of the substrate, and
        the material of the material layer comprises one or more of a metal, a metal compound, or a metal alloy.

2. The silicon-based photoelectric multiplier device according to claim 1, wherein the material of the material layer is chosen such that a reflectivity of light with a wavelength in a range of about 1000 nm incident on an interface between the first layer and the material layer is less than 25%.

3. The silicon-based photoelectric multiplier device according to claim 2, wherein the substrate is one or more of a conductive, a semiconductor, or an insulating type.

4. The silicon-based photoelectric multiplier device according to claim 3, further comprising:
    a first electrode disposed above the first layer, a second electrode disposed below the first layer, and a third electrode disposed above the first layer.

5. The silicon-based photoelectric multiplier device according to claim 4, wherein the third electrode is formed on the main upper surface of the first layer or on the main upper surface of the substrate.

6. The silicon-based photoelectric multiplier device according to claim 2, further comprising:
    a first electrode disposed above the first layer, a second electrode disposed below the first layer, and a third electrode disposed above the first layer.

7. The silicon-based photoelectric multiplier device according to claim 6, wherein the third electrode is formed on the main upper surface of the first layer or on the main upper surface of the substrate.

8. The silicon-based photoelectric multiplier device according to claim 1, wherein the substrate is one or more of a conductive, a semiconductor, or an insulating type.

9. The silicon-based photoelectric multiplier device according to claim 8, further comprising:
    a first electrode disposed above the first layer, a second electrode disposed below the first layer, and a third electrode disposed above the first layer.

10. The silicon-based photoelectric multiplier device according to claim 9, wherein the third electrode is formed on the main upper surface of the first layer or on the main upper surface of the substrate.

11. The silicon-based photoelectric multiplier device according to claim 1, further comprising:
    a first electrode disposed above the first layer, a second electrode disposed below the first layer, and a third electrode disposed above the first layer.

12. The silicon-based photoelectric multiplier device according to claim 11, wherein the third electrode is formed on the main upper surface of the first layer or on the main upper surface of the substrate.

* * * * *